US009508616B2

(12) United States Patent
Ahmad et al.

(10) Patent No.: US 9,508,616 B2
(45) Date of Patent: Nov. 29, 2016

(54) METHOD FOR LOWER THERMAL BUDGET MULTIPLE CURES IN SEMICONDUCTOR PACKAGING

(75) Inventors: Iftikhar Ahmad, Raleigh, NC (US); Robert L. Hubbard, Eugene, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 384 days.

(21) Appl. No.: 13/506,722

(22) Filed: May 11, 2012

(65) Prior Publication Data
US 2013/0302917 A1 Nov. 14, 2013

(51) Int. Cl.
| | |
|---|---|
| H01L 21/66 | (2006.01) |
| H01L 23/29 | (2006.01) |
| H01L 21/56 | (2006.01) |
| H01L 21/683 | (2006.01) |
| B32B 41/00 | (2006.01) |
| H01L 23/00 | (2006.01) |
| B32B 38/00 | (2006.01) |

(52) U.S. Cl.
CPC ............. *H01L 22/26* (2013.01); *B32B 41/00* (2013.01); *H01L 21/56* (2013.01); *H01L 21/6835* (2013.01); *H01L 22/14* (2013.01); *H01L 23/293* (2013.01); *B32B 2038/0076* (2013.01); *B32B 2310/0862* (2013.01); *B32B 2457/14* (2013.01); *H01L 22/12* (2013.01); *H01L 24/94* (2013.01); *H01L 2924/1461* (2013.01)

(58) Field of Classification Search
CPC ....... B05D 3/029; H01L 21/56; H01L 22/12; H01L 22/26; H01L 23/293
See application file for complete search history.

(56) References Cited

U.S. PATENT DOCUMENTS

| | | | | |
|---|---|---|---|---|
| 4,904,080 | A * | 2/1990 | Afromowitz | 356/133 |
| 5,738,915 | A * | 4/1998 | Fathi et al. | 427/487 |
| 7,557,035 | B1 * | 7/2009 | Ryan et al. | 438/638 |
| 2010/0314021 | A1* | 12/2010 | Safari Zadeh | 156/51 |

OTHER PUBLICATIONS

Anon. Evaluating Polymer Cure Using Raman Spectroscopy, EAG BioTechnology Application Note BN 1394 (2007).
J. F. Aust et al. Fourier transform Raman spectroscopic studies of a polyimide curing reaction, Analytica Chimica Acta 293:119-28 (1994).
R. Hubbard et al., Low Temperature Cure of PBO Films on Wafers, Proceedings of the 12th International Symposium on Polymers in Microelectronics (2006).

* cited by examiner

*Primary Examiner* — Elena T Lightfoot
(74) *Attorney, Agent, or Firm* — Moser Taboada; Alan Taboada (57) ABSTRACT

A method for forming a multilayer structure comprises the steps of: depositing a first polymerizable layer on a substrate; applying microwave energy to the polymerizable layer while monitoring at least one property of the layer; and, ending the application of microwave energy when the monitored property indicates that the polymerizable layer has reached a desired degree of cure. The property monitored may be optical, e.g., Raman spectrum, or electrical, e.g., dielectric loss. This process control strategy lowers the overall thermal budget, and is especially suitable for curing polymer films on silicon. The method may be used repetitively to cure multiple layers of polymeric material when a thicker film is needed.

13 Claims, 8 Drawing Sheets

PBO

Epoxy

BCB

FIGURE 8

METHOD FOR LOWER THERMAL BUDGET MULTIPLE CURES IN SEMICONDUCTOR PACKAGING

CROSS-REFERENCE TO RELATED APPLICATION

This application is related to U.S. patent application Ser. No. 13/506,723, entitled, Method for Lower Thermal Budge Multiple Cures in Semiconductor Packaging, filed by the present inventors on even date herewith, the entire disclosure of which is incorporated herein by reference.

BACKGROUND OF THE INVENTION

Field of the Invention

The invention pertains to methods for low thermal budget cure of freshly deposited polymeric films during semiconductor packaging. The method more particularly relates to the use of microwave energy for selective curing of primarily the freshly dispensed polymeric film among multiple polymeric materials used in prior semiconductor packaging steps.

Description of Related Art

Assembly and Packaging provide the means for cost effective incorporation of functional diversification through various technologies that enable continued increase in functional density and decrease in cost per function required to maintain the progress in cost and performance for electronics. New architectures that include printed circuits, thinned wafers and both active and passive embedded devices are emerging as solutions to market requirements. The materials and equipment used in assembly and packaging are also changing rapidly to meet the requirements of these new architectures and the changing environmental regulatory requirements.

Wafer level packaging (WLP) is defined as a technology in which all of the IC packaging steps are performed at the wafer level, with all package I/O terminals continuously located within the chip outline (Fan-in design) producing a true chip size package. WLP provides a solution for the situation where requirements for size, operating frequency and cost reduction cannot be met by traditional packaging (e.g. wire bonding or flip-chip bonding). There are, however, products that do not fall under the above definition of WLP. These new packages are described as "Fan-out" WLP or "embedded" WLP, and are fabricated by placing individual die into a polymer matrix that has the same form factor as the original silicon wafer. The "Reconstituted" artificial wafers are then processed through all of the same steps that are used for actual silicon wafers, and finally diced into separate packages. The die is placed in the polymer matrix such that there is a rim of polymer surrounding each die. With this technology, it is no longer only intact silicon wafers that can be processed as a "WLP", but hybrid silicon/polymer matrices in wafer form that also can now be classified as WLP products. With die placement in a polymer matrix there becomes a need to cure the polymer material as well as a need for higher-level re-distribution layers to "fan-out" the I/O to the outside perimeter of each die.

WLP technology also includes wafer level chip size packages (WLCSP), fan-out wafer level packages, wafer capping on MEMS, wafer level packages with Through Silicon Vias (TSVs), wafer level packages with Integrated Passive Devices (IPD), and wafer level substrates featuring fine traces and embedded integrated passives. All these technologies become the building blocks for 3D Wafer Level Packages (3DWLP).

In recent years Wafer Level Packaging of CMOS image sensors has attracted substantial effort and attention. The fabrication techniques for Wafer Level Cameras (WLC) used in modern camera systems and mobile phones involve the use of Opto Wafers and CMOS-Wafers, which are mounted by Wafer Level Packaging (WLP) approaches. A typical Wafer Level Camera consists of several optical elements that need to be assembled quite accurately to provide the best possible optical performance. The packaging and replication of micro-lens wafers (opto wafers) uses UV curable materials which are currently used for mass production in the electronics and optics assembly industries. Depending on the chemical basis—acrylic or epoxy—these materials differ in some of the basic parameters. Acrylic adhesives are known to be very fast curing, but are limited at high temperature processes and have high polymerization shrinkage. On the other hand, epoxy based systems are known for good thermal stability and low shrinkage and are therefore used in high reliability applications. The challenge as seen by the industry for Wafer Level Optics (WLO) manufacturing is to develop materials or processes with fast curing mechanisms, high optical transmission and high thermal stability.

At the substrates level, fine design rules and the capability of creating integrated passive devices are attractive features. Dielectrics and traces are built on silicon substrates by wafer process technology and the following assembly is performed on the wafer level substrate. Some wafer level substrates are not made of silicon but dielectric layers and traces built up on a wafer. The Inter Layer Dielectric (ILD) materials used to electrically separate closely spaced interconnect lines are arranged in several levels (multi-level metallization) in an advanced integrated circuit. These materials must feature low dielectric constant k to minimize capacitive coupling between adjacent metal lines.

Thus, polymers are a key building block for all WLP and related technologies. Many different classes of useful polymeric materials are known, including polyimide (PI), polybenzoxazole (PBO), benzocyclobutene (BCB), silicones, acrylates and epoxies. Curing and the resulting shrinkage also play an important role due to temperature sensitive devices and the topography of the metallization which has to be passivated.

Work is underway on materials which include but are not limited to: use of polyimide material as a temporary adhesive for bonding thinned wafers to a carrier wafer for processing; use of polyimide material as a permanent adhesive for bonding of wafer/chip stacks; use of a PBO dielectric to bond backside circuitry onto thinned wafers (for lower temperature cure avoiding damage to structures on the wafer); and new over molding compounds for semiconductor packaging materials to prevent die shift in fan-out packaging.

The use of polymeric materials in all of the areas addressed above and their lower thermal budget cure is therefore very important in wafer level packaging. There are several methods for forming thin films on substrates. The simplest and the least expensive is spin coating (e.g. of polyimide on silicon wafer), where the material (usually in solvent) is dropped on the substrate surface and spun up to 5000 rpm (usually 1500-3000), to form a uniform film (~2-10 μm) on planar substrates only. The turntable may be allowed to rotate even after spreading the material to evaporate the solvent. Then a low temperature or "soft-bake" step (~100° C.) is carried out to dry the film and finally followed by a higher temperature cure (e.g. >300° C. for polyimide).

Most films deposited need a heat treatment. The organic materials need to be cured well to provide optimum dielectric properties. Some heat treatments could be carried out during the deposition process or in the same chamber, but usually the cures are time consuming and hence the thermal treatment is performed separately in a following step. Thus, the thermal treatment for polymeric cure is conducted in ovens, on hot plates, or by microwave heating.

It should be pointed out that either inadequate or excessive cure of dielectric films can cause serious problems in microelectronic packaging whether curing is done by microwave, induction, conduction, or convection. If a film is incompletely cured then subsequent exposure to solvents and development chemicals will cause the leaching of uncured molecules out of the film. This causes cracking that often allows both open and shorted circuits at the microscopic level. If a film is excessively heated beyond the desired complete cure, there is decomposition and degradation of the film which also causes microscopic opens and shorts as well as modification of the dielectric and thermomechanical properties of the polymers. When either of these conditions happens in lower layers of a multilayer film, these defects are not easily seen due to the opacity of each polymer layer in its cured state. Identification of the source circuit failures in these cases is very difficult, time-consuming and expensive. If the failures happen in the field, the reliability of the product is affected.

In contrast to microwave heating, conventional heating methods are not self-limiting. In addition, conventional heating is an "outside-in" phenomenon. Heat must penetrate slowly through outside layers to reach inner layers, so the curing process of polymers completes the curing of internal molecules only after all other molecules have transferred the heat to the inside by conduction. This process produces the well-known "skinning" of over-cured outside layers that produces degradation, non-uniformity and warpage in the polymer layers.

This situation makes it difficult for practitioners to use an approach that intentionally under-cures a lower layer with the intention of that layer becoming completely cured during subsequent thermal processing. Since the cure time is much longer for each of the multiple films deposited for fabrication of a device, there is a tendency not to fully cure a prior film and let it cure completely during a subsequent heating cycle to cure the latter film. During these conventional heating steps it is common practice to use long ramp times of increasing temperature to minimize stress and warpage as much as possible. Reduced yields, high warpage, and reliability issues are common traits of polymer film curing of electronic assemblies.

Objects and Advantages

Objects of the invention include: providing a method for curing polymer films with a reduced thermal budget; providing a method for curing polymer films while monitoring the state of cure; providing a method for curing polymer films applied in multiple layers; providing a method for curing a polymer film that is deposited on an existing polymer film that has already been cured; providing a method for curing a polymer film without over-curing an underlying film; providing a multilayer polymer film in which successive layers have different microwave curing behaviors; providing a multilayer polymer film in which each successive layer has greater dielectric polarizability than the preceding layer; and, providing materials and methods for microelectronic packaging with reduced thermal budget. These and other objects and advantages of the invention will become apparent from consideration of the following specification, read in conjunction with the drawings.

SUMMARY OF THE INVENTION

According to one aspect of the invention, a multilayer structure comprises: a substrate; a first polymerizable layer having a first dielectric polarizability; and, a second polymerizable layer on top of the first layer and having a second dielectric polarizability greater than the first dielectric polarizability so that the second polymerizable layer will absorb microwave energy preferentially to the first layer.

According to another aspect of the invention, a multilayer structure comprises: a substrate; and, a plurality of polymerizable layers successively deposited on the substrate, with each successive layer having a greater dielectric polarizability than the preceding layer(s), so that each successive layer will absorb microwave energy preferentially to the preceding layer(s).

According to another aspect of the invention, a method for making a multilayer structure comprises the steps of: depositing a first polymerizable layer having a first dielectric polarizability on a substrate; exposing the first layer to microwave energy for a time-temperature profile sufficient to effect a desired degree of cure; depositing a second polymerizable layer having a second dielectric polarizability greater than the first dielectric polarizability so that microwave energy will heat the second layer preferentially to the first layer; and, exposing the second layer to microwave energy for a time-temperature profile sufficient to effect a desired degree of cure in the second layer.

According to another aspect of the invention, a method of making a multilayer structure comprises the steps of: depositing a plurality of polymerizable layers on a selected substrate, each successive layer having greater dielectric polarizability than that of the preceding layer(s); and, exposing each of the polymerizable layers to microwave energy for a time-temperature profile sufficient to achieve a desired level of cure before depositing the successive layer(s).

According to another aspect of the invention, a method for forming a multilayer structure comprises the steps of: depositing a first polymerizable layer on a substrate; applying microwave energy to the first polymerizable layer while monitoring at least one property of the layer; and, ending the application of microwave energy when the monitored property indicates that the polymerizable layer has reached a desired degree of cure.

According to another aspect of the invention, a method for forming a multilayer structure comprises the steps of: depositing a first polymerizable layer on a substrate; applying microwave energy to the first polymerizable layer; monitoring the microwave power demand needed to maintain a selected heating rate; and, ending the microwave heating when an increase in microwave power demand indicates that a selected degree of cure has been achieved in the polymerizable layer.

According to another aspect of the invention, a method for forming a multilayer structure comprises the steps of: depositing a first polymerizable layer on a substrate; applying microwave energy to the first polymerizable layer while monitoring the Raman spectrum of the first polymerizable layer; and, ending the microwave heating when the Raman spectrum indicates that a selected degree of cure has been achieved in the polymerizable layer.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

FIG. 1 illustrates the increase in microwave power used as a polymeric material is cured. The lower power requirement while the material is uncured signifies the easier interaction of microwaves within the uncured polar groups of molecules. When these molecules cross-link or polymerize they do not respond to microwaves as well and more microwave power is required to maintain the same cure temperature. This understanding and its use constitutes an important aspect of this invention.

DETAILED DESCRIPTION OF THE INVENTION

One aspect of the invention relates to a method for selectively microwave heat treating only a freshly deposited film on a substrate that may already have previously cured or partially cured films. It relies on Applicants' discovery that, by tailoring the dielectric polarizability of succeeding layers, they can be selectively heated by microwaves preferentially to earlier-formed layers, thereby effecting a cure of the most recent layer without over-curing underlying (previously cured) layers. Furthermore, microwave curing tends to interact on a volumetric basis, curing the film throughout its thickness, rather than curing from the outermost surface inward. Conventional thermal cure processes cannot accomplish this for two reasons: First, thermal curing relies on conduction from the outside surface; polymer materials tend to be poor conductors, so the film tends to be slightly over-cured at the surface and slightly under-cured in the interior, where, unfortunately, good curing is essential for proper adhesion to the substrate. Second, conventional thermal heating affects all of the layers, thereby increasing the thermal budget of the previously-cured layer(s).

A key advantage of the invention is that microwave energy interacts selectively and preferentially with the freshly dispensed polymeric materials. The epoxy, PI, and PBO materials have dipoles which readily respond to microwave energy through rotational movement. As these molecules react and/or cross-link, they form longer and more complex chain lengths which have much more restricted movement. As the reactions continue there are fewer mobile species to interact with the microwave field. Thus, molecules that are free to rotate readily respond to microwaves and absorb microwave energy, but as the polymers react and/or cross-link, they become more rigid, respond less readily, and absorb less microwave energy. Thus in a package of multiple layers of polymeric films, microwave energy will selectively interact with freshly applied polymer resins (highly polarizable), while other films that have been cured in prior processes (poorly polarizable) are too rigid to absorb substantial microwave energy.

Variable Frequency Microwave (VFM) is well suited for processing semiconductor materials and thin film coatings used for numerous electronics, flat panel displays and photovoltaic applications. The basic VFM approach is well-known and taught in at least the following U.S. patents, each of which is incorporated herein by reference in its entirety: U.S. Pat. Nos. 5,321,222; 5,721,286; 5,961,871; 5,521,360; 5,648,038; 5,738,915; and 7,939,456. In particular, the continuous sweeping of frequencies over the available bandwidth, as taught in the aforementioned references, reduces the potential for arcing and subsequent damage. Frequency sweeping is often carried out by selecting a center frequency and then rapidly sweeping the frequency in a substantially continuous way over some range (typically +/−5% of the center frequency, although this range can vary depending on such factors as the type of microwave source, and the overall size of the cavity compared to the microwave wavelength). Numerous kinds of wafers with integrated circuits have been exposed to VFM and it has been demonstrated that there is no damage to the circuits or their functionality. The use of VFM provides more rapid processing as compared to conventional heat treating furnaces.

As noted earlier, one objective of the invention is to provide rapid and uniform low thermal budget microwave heat treatment of thin film coatings on substrates, especially those with metallization that cannot be easily processed with single frequency microwave because of the potential for charge build-up, leading to arcing and hence damaging the electronic devices or circuits. However, on substrates, especially those with simple organic coatings and little or no metallic traces, single frequency microwave sources may be used and are thus considered within the scope of the invention. For many microelectronic applications Variable Frequency Microwaves (VFM) sources will be preferred.

It is instructive to review the general cure dynamics of a polymeric material when heat treated with microwave energy. To consider the analogy of heating food with microwaves: the polar water molecules in the food are set into rotation, and friction between adjacent molecules rapidly heats the food throughout its entire volume, rather than from the surface as is the case in conventional cooking appliances.

The same applies to polar groups or molecules in any polymeric or organic material. Depending on the starting viscosity of the organic material, the rotational movements of the polar groups or molecules may be somewhat restricted as compared to the free rotation of a water molecule. However, there is still the additional rotational movement as compared to other heating methods. This additional mobility of the monomers and ionomers enhances the probability of their cyclization or cross-linking with other available monomers or chains and thus polymerizing or curing occurs at rates faster than conventional heating methods.

As the polymerization or cure extent advances, the available mobile polar groups are depleted through cross-linking. The crosslinked chain lengths (or molecular weights) get larger, and the interaction of larger networks of chains with microwave energy becomes more restricted. Applicants have found that, with time, more power is required to maintain the same cure temperature for the same material. The higher power requirement to maintain temperature essentially signifies that the coupling efficiency or the absorption of the material has been reduced. In the case of cyclization of thermoplastics the effect is to increase rigidity of the long chains and thus cause the same effects.

Figure 1:
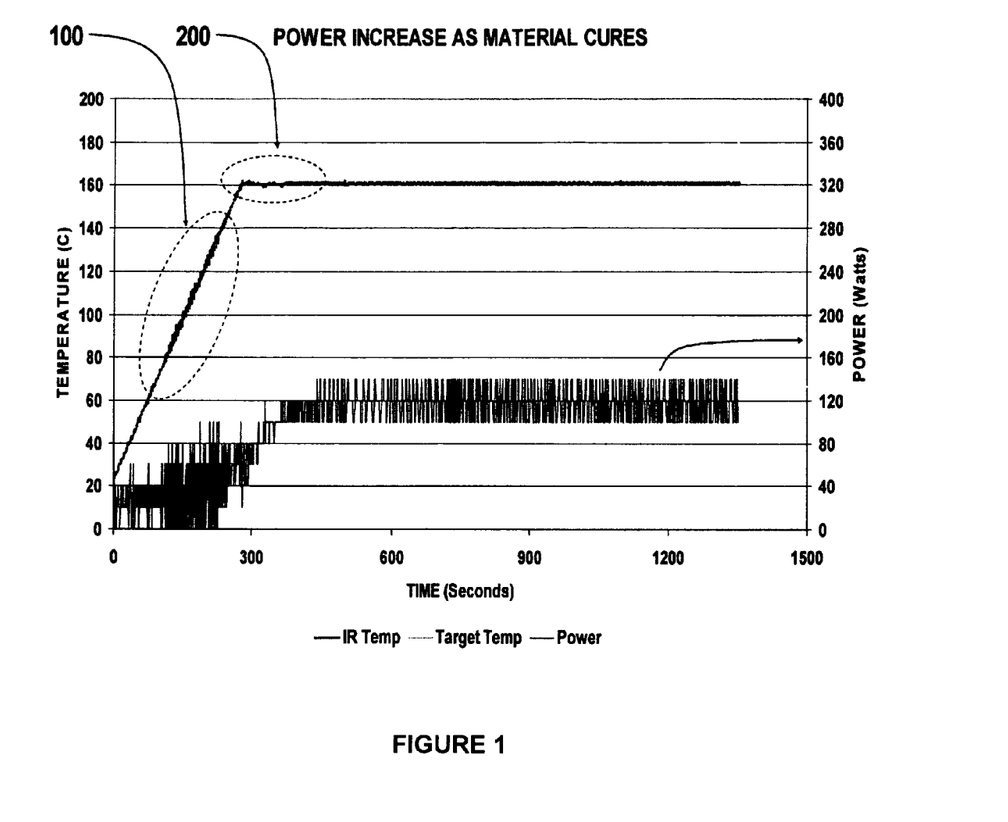

This phenomenon is illustrated in FIG. 1, which shows the temperature versus time plot along with the power requirement as a function of time, or essentially extent of cure. It is clear from the plot that during the ramp 100 (area in the dashed line ellipse) where the polymer is still in the uncured state and microwave interaction with the material is good, little microwave power (<80 W) is necessary to continue to heat it and take it to the cure temperature. Also note the rapid change in temperature plot as power changes to maintain the requested target temperature. The temperature fluctuations are higher and the corresponding changes in power to control the temperature at the target temperature are also larger. As the material starts to gel, the microwave power required starts to increase. During soak temperature as the cure extent advances 200 (area in the dashed line ellipse) the power is still increasing until it reaches a level (up to 140 W) sufficient to maintain the cured polymer at the target temperature. Applicants' discovery that microwave power demand can be used as a proxy for degree of cure forms the basis for one aspect of the invention.

Figure 5:
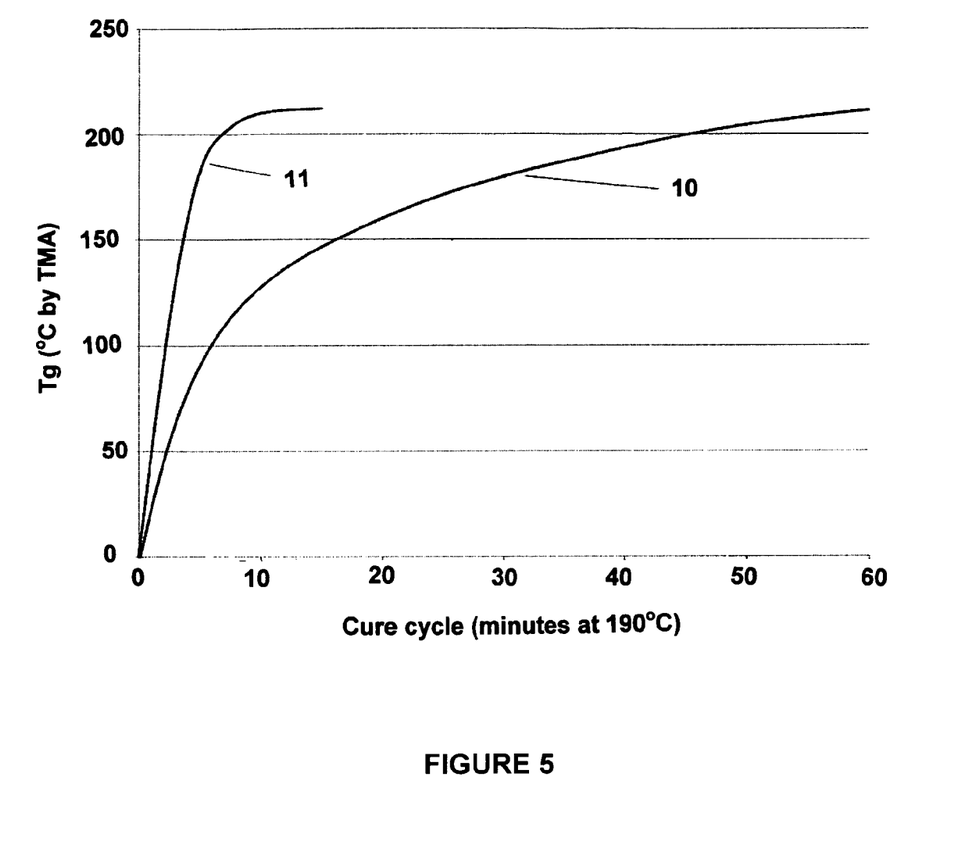
FIG. 5 shows the comparison of glass transition temperature ($T_g$) for convection cure and Variable Frequency Microwaves (VFM) cure of a JSR wafer coating material WPR 1201. Clearly, VFM cure and corresponding $T_g$ are much higher than convection cure.

Thermal energy produced by induction, conduction, or convection causes random molecular motion of all molecular species in a progressive fashion through the bulk of a material. Since this energy is consumed by all molecular species, whether cured or un-cured, the extent of cure (completion of cure reactions) is gradual to completion as shown by trace 10 in FIG. 5, which illustrates the extent of cure as measured by temperature of glass transition ($T_g$) vs. reaction time. In contrast, microwave energy selectively continues to heat only un-reacted species so the cure reaction is selective and highly efficient until the extent of cure is very high as shown by trace 11 in FIG. 5. It is well known that the last few percent of cure of cross-linked polymers is constrained by steric hindrance so additional applied heat merely causes molecular motion and eventually degradation. FIG. 5 shows that microwave curing produces less total thermal exposure as demonstrated by the much smaller area under trace 11 than trace 10 and is therefore much less likely to cause excessive heating beyond that necessary to complete cure. The amount of cure was shown in FIG. 1 to correlate to increasing power until the saturation of power at 440 seconds. At that point the cure is substantially complete and the microwave energy is only causing large scale molecular translations.

A surprising result from VFM cure of polymer films is the smaller effect of time than temperature in cure extent by a factor of about three. This allows the use of progressively lower film cure temperature on each layer of identical materials without substantially increasing time of cure (only minutes) beyond practical limits. In contrast, increased subsequent cure temperatures are necessary with conventional heating due to the need to also heat the already cured previous layers of film. Any progressively lowered temperatures with conventional heating increases film cure times to impractical levels (in hours).

As an additional improvement, if the point of complete cure can be known with VFM cure then the next layer could be safely added and cured with a combination of lower temperature and lower power saturation. It has been found that there is a relationship between temperature of cure with VFM and several material variables including chain endcap dipole strength, cross-linker dipole strength, promoter, solvent, and backbone type. Small changes in these variables can be seen to reduce film cure temperature while maintaining equivalent thermo-mechanical properties ($T_g$, modulus) of each resulting film layer. Manipulation in this manner would produce completely cured, nearly identical film layers at each step. In contrast, it is well known in the art that when using conventional thermal cure it is only possible to lower film cure temperatures by the use of entirely different chemical structures, which will inherently lead to chemical adhesion incompatibilities and very different thermo-mechanical properties with attendant stress and adhesion issues.

With the inherent nature of instantaneous bulk microwave energy absorption (the theoretical penetration depth is around two meters in polymers), unreacted resin molecules in all layers are affected simultaneously to the same extent. This leads to the adhesion process between all layers occurring simultaneously with microwave cure whereas with conventional heating, adhesion at internal interfaces is the last chemical reaction to occur. It is known by practitioners in microelectronics that a final higher heating step is often required to produce adequate adhesion.

The data in FIG. 5 represent bulk polymeric material and may be difficult to observe on a thin film, however, the reaction kinetics remain the same and will certainly apply to polymeric films as well. Thus, the above discussion demonstrates that the use of microwave treatment on materials and films is most beneficial while they are still in the uncured state, not on a material that is mostly cured where most of the polar groups or molecules are consumed in the cross-linking or cyclization process.

Thus, the greatest effect of microwave energy among the multiple polymeric films will be selectively felt by the freshly deposited film compared to the previously cured films. Applicants' understanding that microwave heat treatment of the freshly deposited film will have little or no impact on the prior films, forms the basis for another important aspect of this invention.

EXAMPLE

Figure 2:
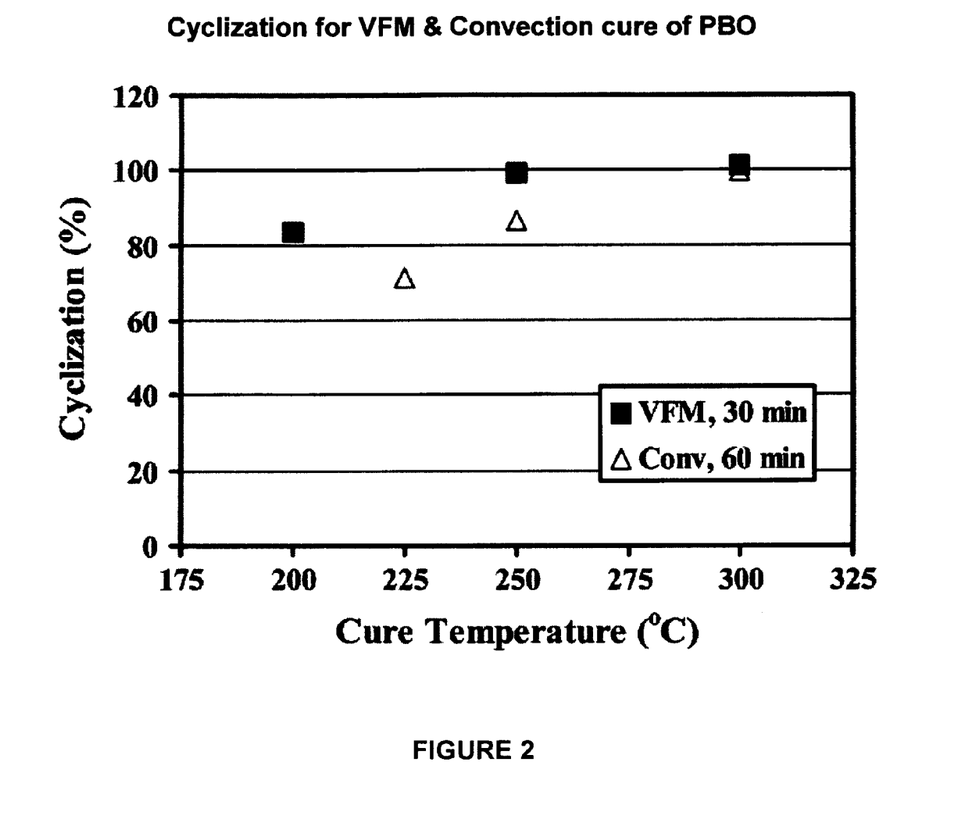
FIG. 2 shows the degree of cyclization of the PBO deposited on wafers cured using VFM and convection methods as a function of curing temperature. The degree of cyclization is higher for VFM as compared to convection.

Curing tests were done in a MicroCure™ 3100 Controlled Environment System (Lambda Technologies, Morrisville, N.C.). The data shown in FIG. 2 compare the degree of cyclization of the PBO deposited on wafers and cured using VFM and convection methods as a function of curing temperature. The degree of cyclization at 200° C. for 30 minutes is higher for VFM as compared to convection at 225° C. for 60 minutes, showing the advantage at lower temperatures. With VFM the cyclization was completed at 250° C. in 30 minutes whereas convection requires higher temperature of 300° C. and for longer time of 60 minutes.

EXAMPLE

Figure 3:
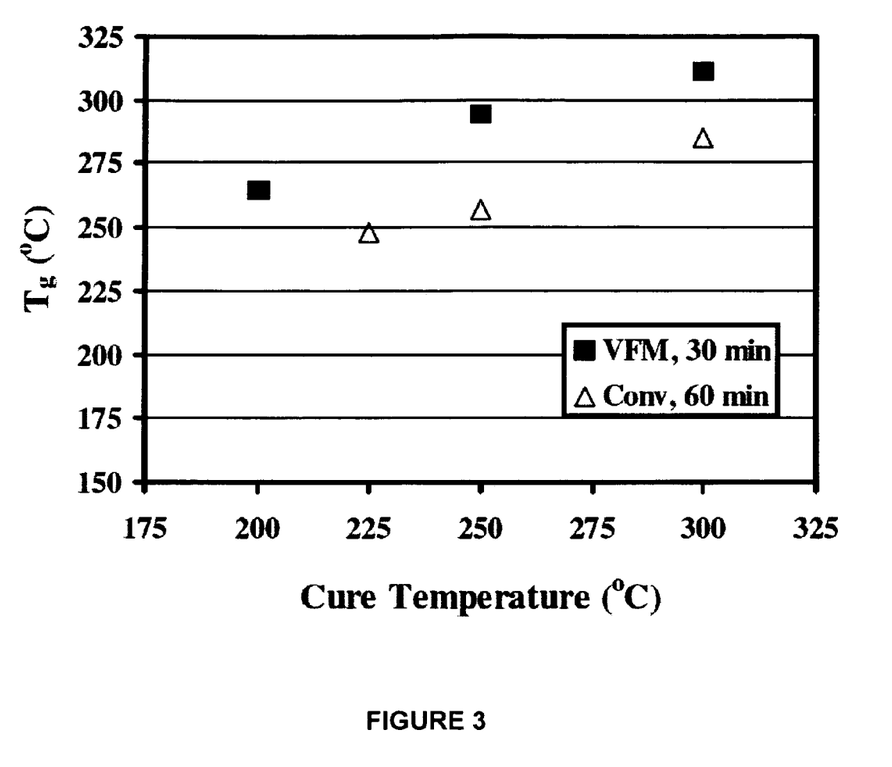
FIG. 3 shows the glass transition temperature, $T_g$, of PBO deposited on wafers and cured using VFM and convection methods as a function of curing temperature, with higher $T_g$ for VFM as compared to convection.

FIG. 3 shows the glass transition temperature, $T_g$, of PBO deposited on wafers cured using VFM and convection methods as a function of curing temperature, with $T_g$ higher for VFM as compared to convection. For all temperatures VFM cured $T_g$ of PBO is higher than convection temperatures.

EXAMPLE

Figure 4:
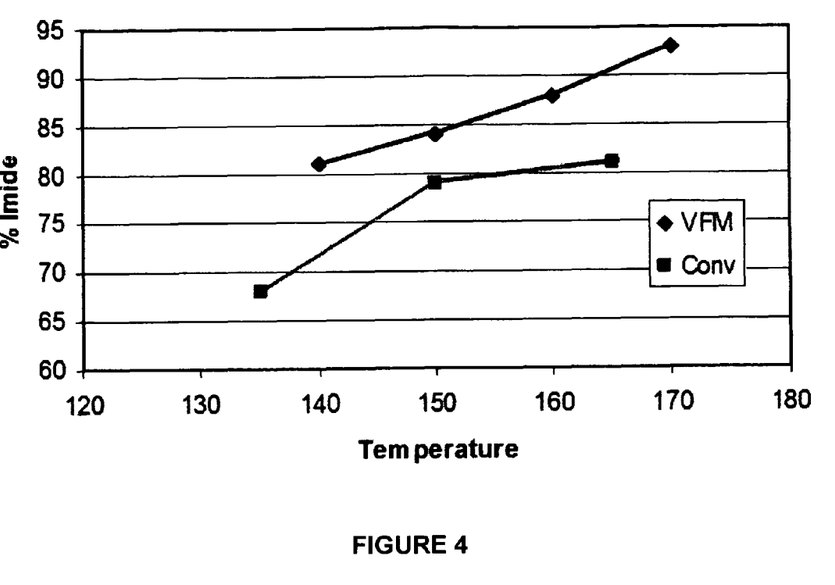
FIG. 4 shows the imidization of PI as a function of temperature. The imidization with VFM is higher as compared to convection.

FIG. 4 compares the low temperature (<200° C.) imidization of PI 2525 from Hitachi DuPont MicroSystem (HDM) as a function of temperature for VFM and convection. The imidization values with VFM are higher than convection showing the low temperature advantage of VFM interaction with polar molecules.

EXAMPLE

The warpage (expressed in μm above the plane) on a 200 mm wafers with PI and PBO films cured with VFM and a conventional furnace are shown in the table below. The advantage is more than VFM rapidly curing these films and at lower temperature. The rapid internal and uniform heating with VFM also induces low stress in cured films so the warpage on the wafers is less for VFM than furnace cure.

|  | Conventional | | VFM | |
| --- | --- | --- | --- | --- |
|  | X-axis | Y-axis | X-axis | Y-axis |
| PBO | 71.92 | 66.18 | 31.32 | 31.49 |
| PI | 56.28 | 46.05 | 24.88 | 23.55 |

EXAMPLE

The MicroCure™ 2100 VFM has a single wafer VFM processing cavity where curing experiments have been performed. It will be appreciated that for large-scale production, two alternative configurations can be used. First, a single robot can be used to load/unload wafers into multiple VFM chambers to increase the throughput. Alternatively, a High Volume Manufacturing (HVM) tool, has a cavity that can accommodate a batch of wafers for curing deposited coatings. One example of this type of tool is the MicroCure™ 8100 [capable of handling 25 wafers and powered by a 2.25 kW High Power Amplifier]. This HVM tool has been shown to provide uniform heating, validated with 5 thermocouples located on one SensArray™ wafer and 5 thermocouples distributed over the stack of wafers.

EXAMPLE

FIG. 5 shows the comparison of glass transition temperature ($T_g$) for convection cure and Variable Frequency Microwaves (VFM) cure of a JSR wafer coating material WPR 1201. Clearly, VFM cure and corresponding $T_g$ are much higher than convection cure.

EXAMPLE

Figure 6:
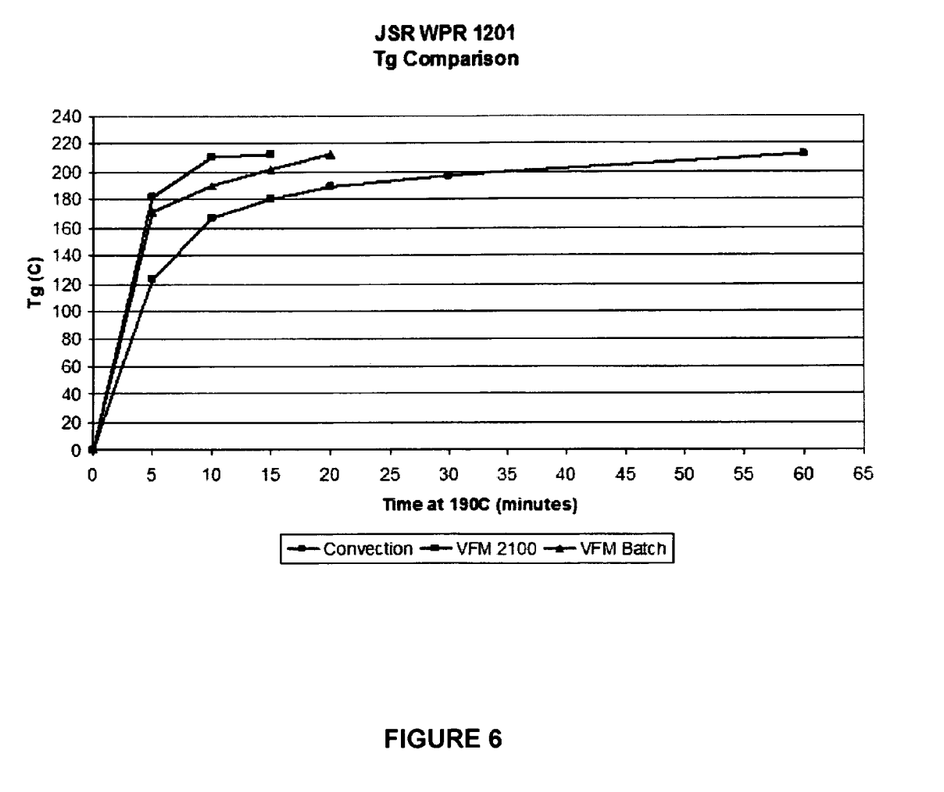
FIG. 6 shows the comparison of glass transition temperature ($T_g$) for convection cure and Variable Frequency Microwaves (VFM) cure of a JSR wafer coating material WPR 1201 in a single wafer tool and batch tool. VFM cure and corresponding $T_g$ are much higher than convection cure for both VFM systems.

FIG. 6 shows the comparison of glass transition temperature ($T_g$) for convection cure and Variable Frequency Microwaves (VFM) cure of a JSR wafer coating material WPR 1201 in a single wafer tool and batch tool. For the same temperature and time, VFM interaction with the uncured polar groups gives a higher $T_g$ than convection cure. In the first 5 minutes at 190° C. convection cures produced a $T_g$ of 120° C., whereas 5 minutes of VFM cure at 190° C. produced a $T_g$ of 180° C. The acceptable $T_g$ of ~210° C. for this material was achieved in 10 minutes with VFM as compared to one hour with convection cure.

EXAMPLE

Figure 7:
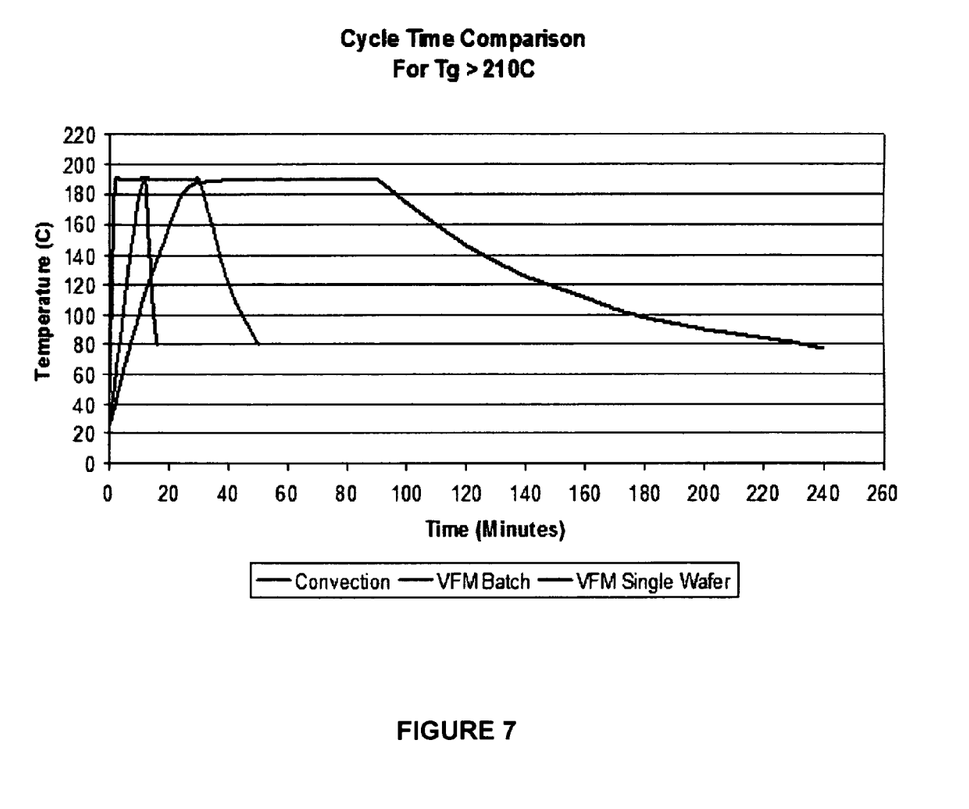
FIG. 7 shows the comparison of process cycle and essentially the thermal budget for convection, a single wafer VFM tool and a VFM batch tool.

FIG. 7 shows the comparison of process cycle and essentially the thermal budget for convection, a single wafer VFM tool and a VFM batch tool. In the VFM single wafer tool, the sample has cured and cooled to below 80° C. in less than 20 minutes, and in the VFM batch tool in 50 minutes, compared to ~240 minutes in a convection oven. This demonstrates clearly the significant reduction in thermal budget using either VFM tool compared to using a conventional oven.

EXAMPLE

The aforementioned High Volume Manufacturing (HVM) batch cavity that can accommodate a batch of wafers (~25) has also been used for curing wafer coatings. The cavity is loaded from the bottom using an elevator. The elevator is lowered and the wafers are loaded onto a wafer boat capable of holding the batch of wafers. The elevator is then raised to seal the chamber. VFM power is then delivered into the chamber to process the batch of wafers simultaneously. After the cure of wafer coating the elevator is lowered to remove the wafers. An important parameter for processing a batch of wafers is the temperature uniformity within a wafer as well as wafer-to-wafer.

EXAMPLE

Cure of Polyimide Films

Polyimide films of numerous kinds and from various vendors have been spin coated on silicon wafers and soft baked for ease of transportation. These films are usually cured in convection or diffusion ovens at high enough temperatures (350-400° C.) to assure adequate mechanical and electrical properties.

There is great emphasis in the semiconductor industry to reduce the thermal budget in processing these wafers. This invention provides a method for low thermal budget and low stress process cure of these dielectric films through volumetric and uniform heating using microwave, preferably Variable Frequency Microwaves (VFM) at temperatures usually lower than other heat treatments. VFM has been successfully demonstrated to cure polyimide at temperature 50-150° C. lower than the standard convection cure temperatures while maintaining the necessary final mechanical and chemical film properties. The following polyimide materials from HD Microsystems; PI-2525, PI-2611, PIX-3400, PIX-8103, SPL-6000, SPL-1708 and HD-8800 have been cured with VFM with substantial reduction in thermal budget (saving in time and/or temperature) depending on the availability of the polar groups.

EXAMPLE

Cure of BCB & PBO Films

Similar to the polyimide films described above benzocyclobutene (BCB) 3022-63 from Dow Chemical Company and polybenzoxazoles (PBO) have also been spin coated on silicon wafers and soft baked at 100-120° C. before VFM cure. PBO films are cured at high enough temperatures (~375° C.) for a fairly long process time (~5 hours). VFM was able to cure the PBO films at 350° C. in only 15 minutes. These films were cured with VFM and the interaction with more polar molecules has resulted in reduction of time (and/or temperature).

Any prior cured films on the wafers will have absorbed little VFM and the additional 15 minute cure of the fresh films will not over cure the prior films.

EXAMPLE

VFM Imidization of Co-Deposited Monomers

The earlier examples used spin coater equipment for depositing the film. However, there are disadvantages to the spin coating approach which include contamination of the films by residual solvents, film shrinkage, poor control of molecular orientation and environmental handling issues with solvent disposal. An alternative to this method involves co-deposition of monomer precursors onto a substrate. With Vapor Phase Deposition (VPD) monomer precursors for polyimide are co-deposited and subsequently imidized, the process produces polyimide films with material properties and uniformity that are superior to the spin-coated films.

Like many other polyimide cure processes, there can be a relatively lower temperature soft bake during or after the deposition followed by high temperature final cure. This final cure temperature is usually in the 350-400° C. range. However, VFM cure has been performed in the 200-250° C. with properties comparable to those performed at high temperature with conventional method. The polar groups in monomer precursors interact with VFM to provide a low thermal budget cure without adversely affecting the prior cured film.

Figure 8:
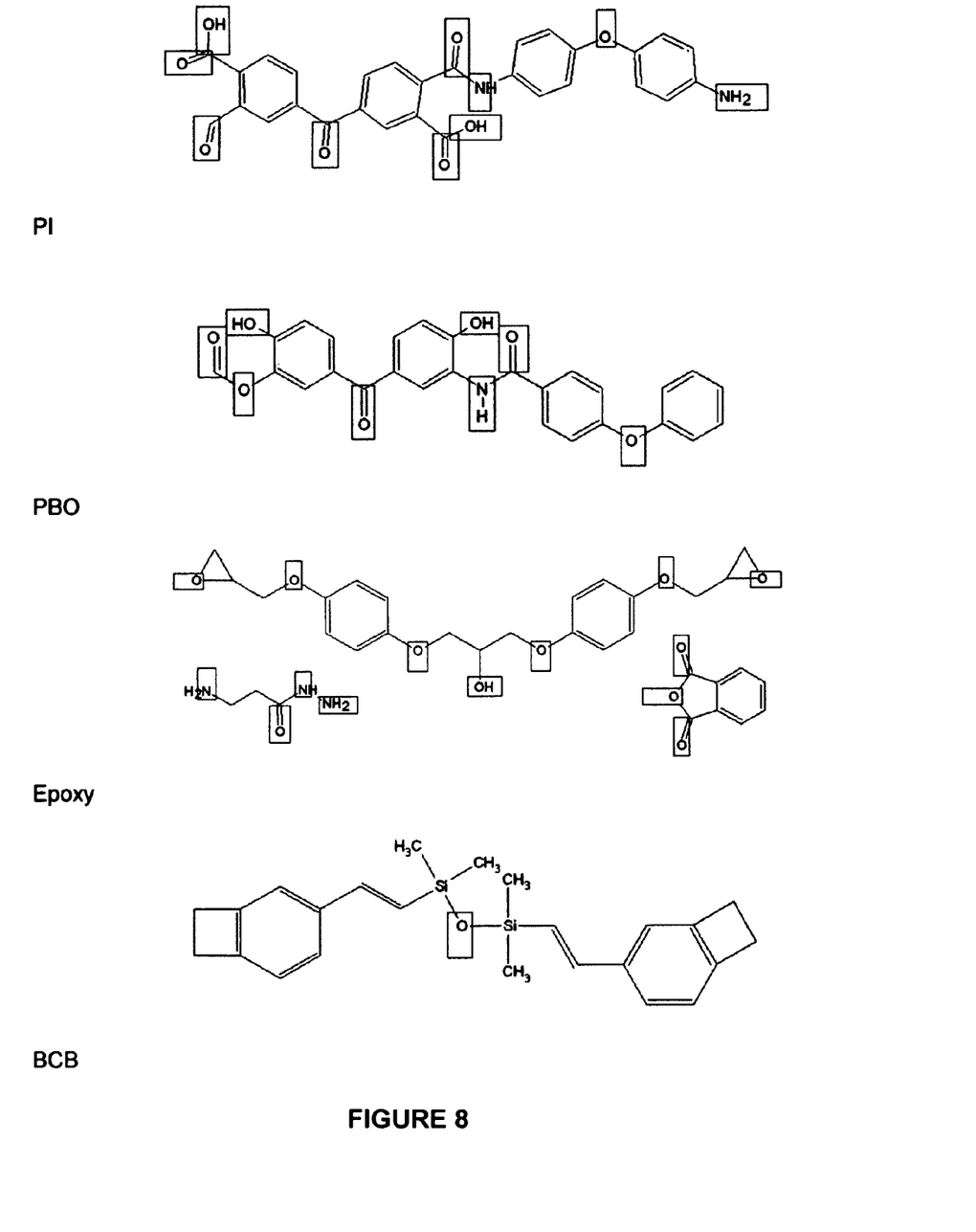
FIG. 8 shows the locations of dipole groups in several types of polymer systems.

As noted earlier, one aspect of the invention involves the use of a series of polymeric materials, all of which belong to one general chemical family (e.g., PI, PBO, epoxies, etc.) but are each modified so they differ from one another in dielectric polarizability. As taught by Hubbard et al. [R. Hubbard, K. Hicks, M. Ohe, and T. Kawamura, "Low Temperature Cure of PBO Films on Wafers", *Proceedings of the 12th International Symposium on Polymers in Microelectronics,* May, 2006], there are several ways to modify the dielectric properties of polymers while staying within one selected molecular family. FIG. 8 illustrates the location of dipoles in several types of resins used in conventional polymer systems (dipoles are enclosed in boxes in the molecular diagrams). The following table lists dielectric polarizability in longitudinal, transverse, and vertical directions for various bonds (dipoles) in various molecular contexts. It can be seen that many options are available to modify the dielectric polarizability of different resins within a particular chemical family simply by changing the amount and type of a particular dipole species.

| Bond | Context | $b_L$ | $b_T$ | $b_V$ |
|---|---|---|---|---|
| C—H | Alkane | 0.65 | 0.65 | 0.65 |
| C—C | Alkane | 0.97 | 0.26 | 0.26 |
| C—C | Cyclopropane | | | |
| C—C | Cyclobutane | | | |
| C=C | Alkene | 2.80 | 0.73 | 0.77 |
| C≡C | Alkyne | 3.79 | 1.26 | 1.26 |

-continued

| Bond | Context | $b_L$ | $b_T$ | $b_V$ |
|---|---|---|---|---|
| Ar—Ar | Biphenyl | | | |
| C—F | MeF | 1.2 | 0.4 | 0.4 |
| C—Cl | MeCl | 3.18 | 2.2 | 2.2 |
| C—Cl | t-BuCl | 3.94 | 1.81 | 1.81 |
| C—Cl | PhCl | 4.2 | 1.9 | 1.5 |
| C—Br | MeBr | 4.65 | 3.1 | 3.1 |
| C—Br | t-BuBr | 5.98 | 2.6 | 2.6 |
| C—Br | PhBr | 6.4 | 2.4 | 2.2 |
| C—I | MeI | 6.7 | 4.8 | 4.8 |
| C—I | t-BuI | 9.2 | 3.7 | 3.7 |
| C—I | PhI | 9.1 | 5.3 | 3.3 |
| c-o | Ether | 0.9 | 0.46 | 0.46 |
| c-o | Acetal | | | |
| C=O | Ketone | 2.3 | 1.4 | 0.5 |
| N—H | Ammonia | 0.5 | 0.83 | 0.83 |
| C—N | Amine | 0.57 | 0.7 | 0.7 |
| N—N | Hydrazine | | | |
| N=N | Azo | | | |
| C=N | Imine | | | |
| C≡N | Cyanide | | | |
| C—S | Sulphide | 1.9 | 1.7 | 1.7 |
| C—CN | t-BuCN | 4.0 | 1.5 | 1.5 |
| S—S | Disulfide | | | |

As taught by Hubbard et al., microwave energy may be absorbed not only by the dipoles that are actually involved in the curing, but also by other dipoles elsewhere in the molecule. It is possible to calculate the total effective polarization of each structure by the matrix addition of the mean of each dipole contribution in each axis. Furthermore, the ability of a molecule to absorb microwave energy will also correlate to some degree with the rigidity of the resin backbone (percent rigid chain length), with a more rigid backbone structure absorbing less energy than a more flexible structure. Other structural modifications and additives that may further affect microwave absorption characteristics include: whether the backbone is aromatic or alicyclic; the dipole strength of the chain endcap; presence or absence of a cyclization promoter; and the amount and dipole strength of the crosslinker.

EXAMPLE

To create a multilayer film having improved microwave curing behavior and superior final properties, the inventive method may be carried out as follows. In these example materials, there were modifications as listed above with the polarizabilities in Debyes, and cure temperatures from 170-200° C.

Similar Example Materials with Modified Properties for Different Temperature Cure

| Mtl. | Ring | Cap pol | X-L pol | X-L amt | Temp | prom. |
|---|---|---|---|---|---|---|
| 9 | aromatic | 3.67 | 7.045 | med | 185 | none |
| 20 | aromatic | 3.78 | 7.56 | hi | 200 | addn |
| 19 | alicyclic | 2.66 | 7.56 | low | 200 | addn |
| 7 | alicyclic | 2.66 | 6.53 | low | 170 | none |

EXAMPLE

To make a film involving two layers on a silicon substrate, the first layer is applied, preferably by spin coating. This layer is modified as outlined in the preceding example to cure with microwaves at 200° C. in 90 minutes. After curing, a second layer is deposited, the second layer being modified to cure with microwaves at 185° C. in 60 minutes. It will be appreciated that the second layer, by virtue of being formulated to have a greater dielectric polarizability than the first layer, will selectively absorb microwave energy, thereby protecting the first layer from over curing. At the same time, because the first and second layers are members of the same general chemical family, they will have similar properties and will adhere well to each other. In the same manner it can be seen that a third layer might be added that was modified to cure with microwaves at 170° C. in 60 minutes. This is compared with a layer of the un-modified material being cured by convection oven at 320° C. in six hours.

Those skilled in the art will appreciate that the invention can be adapted to any number of layers, with each layer modified to have higher dielectric polarizability than the preceding (underlying) layer.

As noted earlier, a further aspect of the invention involves the use of some means to monitor the degree of cure in situ during microwave processing in order to detect the optimal cure point and turn off the microwave power to avoid over curing. This technique may be used to avoid over curing a single polymer film on a substrate and may also be usefully employed with the methods of the preceding examples to further improve the results when multiple layers are cured.

EXAMPLE

To make a film on a silicon substrate, a polyimide, PBO, or epoxy resin is deposited on the wafer by spin coating. Microwave power is applied while monitoring the film temperature, using a control system that provides whatever power is needed to maintain the selected heating profile. A sudden increase in the demanded power, indicating a change in the dielectric loss of the film, is used as a proxy for degree of cure; when this power increase is detected, the cure is deemed to be complete and the power is turned off so as not to over cure the film.

It will be appreciated that the technique described in the foregoing example may be used repeatedly when curing a succession of layers in a multilayer coating process.

Other means, particularly optical techniques, may be used for in situ monitoring of the degree of cure during film processing. Various optical methods may be suitable depending on the specific polymer, substrate, etc. Aust et al. [Fourier transform Raman spectroscopic studies of a polyimide curing reaction, *Analytica Chimica Acta* 293:119-28 (1994)] reviewed the characteristics and limitations of methods such as UV-visible absorbance, fluorescence, near-IR absorbance, mid-IR absorbance, and Raman. They presented Raman spectra for a polyimide over the wavenumber range from 500 to 3500 $cm^{-1}$ and were able to assign specific bending or stretching modes to ten observed peaks in this region.

EXAMPLE

A specific example of the use of Raman spectroscopy may be summarized as follows [Evans Analytic Group application note BN 1394, Evaluating Polymer Cure Using Raman Spectroscopy, May 9, 2007]. This application note illustrates Raman spectra covering wavenumbers between around 1100 and 1900 $cm^{-1}$. The Raman band due to the CONH amide group (mainly C—N stretching) lies around 1350 $cm^{-1}$ and the polyimide C—N stretch is blue-shifted at ~1400 $cm^{-1}$. One can use the relative intensities of these bands to measure the degree of imidization. After a calibration process, the blue shift of the imide C—N stretch band could also be used to evaluate the degree of imidization. Other Raman bands, such as the carbonyl stretch at ~1780 $cm^{-1}$ could be used to evaluate properties such as the polyimide chain length.

IR absorbance may take advantage of the fact that silicon is transparent in the IR, so an IR source and IR detector could be placed on opposite sides of a coated Si wafer so that absorbance by the polymer layer may be measured.

It will be appreciated that a further advantage of the inventive method is that the foregoing electrical and optical properties can be measured in a non-contacting way, and can be carried out within the microwave applicator cavity without perturbing the microwave field or the workpiece.

It will be appreciated that some of the foregoing examples and discussion were presented particularly with VFM systems, but the invention includes all systems that may employ microwave generators using single or multiple magnetrons, klystrons, gyrotrons, or other microwave power generating devices as are well known in the art. The applicator cavity will generally be multimode for larger substrates, but for smaller workpieces a single-mode applicator, as is well known in the art, may be also be used.

We claim:

1. A method for forming a multilayer structure, comprising
   depositing a first uncured polymerizable layer on a substrate;
   applying microwave energy to said first uncured polymerizable layer while monitoring in situ at least one property of said first uncured polymerizable layer;
   ending said application of microwave energy when said monitored property indicates that said first uncured polymerizable layer is cured to a desired degree of cure to make a first cured layer;
   depositing a second uncured polymerizable layer on the first cured layer;
   applying microwave energy to said second uncured polymerizable layer while monitoring in situ at least one property of said second uncured polymerizable layer; and
   ending said application of microwave energy when said monitored property indicates that said second uncured polymerizable layer is cured to a desired degree of cure to make a second cured layer,
   wherein said first uncured polymerizable layer comprises a material having a first polarizability and said second uncured polymerizable layer comprises a material having a second polarizability that is higher than said first polarizability.

2. The method of claim 1 wherein said substrate comprises a silicon wafer.

3. The method of claim 1 wherein said first uncured polymerizable layer and said second uncured polymerizable layer comprise a material selected from the group consisting of, polyimides, benzocyclobutenes and polybenzoxazoles.

4. The method of claim 1 wherein said microwave energy is applied by a VFM source in which the frequency of said microwave energy may be swept over a selected range about a selected center frequency.

5. The method of claim 1 wherein said monitored property is selected from the group consisting of dielectric loss, UV-visible absorbance, fluorescence, near-IR absorbance, mid-IR absorbance and Raman spectrum.

6. The method of claim 5 wherein said dielectric loss is measured indirectly by measuring changes in microwave power demand needed to maintain a selected heating profile.

7. The method of claim 1 further comprising:
depositing a third uncured polymerizable layer on said second cured layer;
applying microwave energy to said third uncured polymerizable layer while monitoring at least one property of said third uncured polymerizable layer; and
ending said application of microwave energy when said monitored property indicates that said third uncured polymerizable layer has reached a desired degree of cure.

8. The method of claim 7 wherein said first and second and third uncured polymerizable layers comprise resins belonging to the same chemical family, and said family is selected from the group consisting of epoxies, polyimides, benzocyclobutenes and polybenzoxazoles.

9. The method of claim 8 wherein said third uncured polymerizable layer has a higher dielectric polarizability than said second uncured polymerizable layer and said second uncured polymerizable layer has a higher dielectric polarizability than said first uncured polymerizable layer.

10. The method of claim 8 wherein said first and second uncured polymerizable layers have similar properties after curing.

11. The method of claim 1, wherein the first uncured polymerizable layer is cured with microwave energy at a first temperature and the second uncured polymerizable layer is cured with microwave energy at a second temperature that is lower than the first temperature.

12. The method of claim 1, wherein the first uncured polymerizable layer is cured with microwave energy at 200° C. and the second uncured polymerizable layer is cured with microwave energy at 185° C.

13. The method of claim 7, wherein said third uncured polymerizable layer is cured with microwave energy at a temperature lower than said second uncured polymerizable layer.

* * * * *